United States Patent
Thakur

(10) Patent No.: US 6,174,651 B1
(45) Date of Patent: Jan. 16, 2001

(54) METHOD FOR DEPOSITING ATOMIZED MATERIALS ONTO A SUBSTRATE UTILIZING LIGHT EXPOSURE FOR HEATING

(75) Inventor: Randhir P. S. Thakur, San Jose, CA (US)

(73) Assignee: Steag RTP Systems, Inc., San Jose, CA (US)

(*) Notice: Under 35 U.S.C. 154(b), the term of this patent shall be extended for 0 days.

(21) Appl. No.: 09/229,872

(22) Filed: Jan. 14, 1999

(51) Int. Cl.$^7$ .................................. G03F 7/00; G03F 7/38
(52) U.S. Cl. .................... 430/327; 430/311; 430/330; 427/58; 427/96; 427/248.1; 427/255.6
(58) Field of Search .................................. 430/311, 327, 430/330; 427/58, 96, 248.1, 255.6

(56) References Cited

U.S. PATENT DOCUMENTS

| | | |
|---|---|---|
| 3,071,856 | 1/1963 | Fischbein . |
| 3,501,334 | 3/1970 | Flaherty . |
| 3,518,110 | 6/1970 | Fischbein . |
| 3,589,606 | 6/1971 | Fish . |
| 3,652,342 | 3/1972 | Fischbein et al. . |
| 4,012,551 | 3/1977 | Bogaty et al. ...................... 428/192 |
| 4,296,208 | 10/1981 | Gagliani et al. ........................ 521/77 |
| 4,305,796 | 12/1981 | Gagliani et al. ................. 204/159.19 |
| 4,495,889 | 1/1985 | Riley .................................... 118/666 |
| 4,532,620 | 7/1985 | Matsuda et al. ..................... 369/136 |
| 4,562,088 | 12/1985 | Navarro .................................. 427/8 |
| 4,919,077 | 4/1990 | Oda et al. ............................ 118/723 |
| 4,986,214 | 1/1991 | Zumoto et al. ...................... 118/722 |
| 5,006,442 * | 4/1991 | Cooper et al. ....................... 430/168 |
| 5,048,163 | 9/1991 | Asmus et al. ........................ 29/25.01 |
| 5,134,961 | 8/1992 | Giles et al. .......................... 118/684 |
| 5,174,826 | 12/1992 | Mannava et al. .................... 118/719 |
| 5,217,559 | 6/1993 | Moslehi et al. ...................... 156/345 |
| 5,238,471 | 8/1993 | Blanchet-Fincher ..................... 96/13 |
| 5,451,260 | 9/1995 | Versteeg et al. ..................... 118/725 |
| 5,512,102 | 4/1996 | Yamazaki ............................ 118/723 |
| 5,522,935 | 6/1996 | Sato .................................... 118/723 |
| 5,540,772 | 7/1996 | McMillan et al. ..................... 118/50 |
| 5,554,486 * | 9/1996 | Garza ................................ 430/273.1 |
| 5,672,393 | 9/1997 | Bachmann et al. .................. 427/493 |
| 5,698,472 | 12/1997 | Harris .................................. 437/239 |
| 5,717,004 | 2/1998 | Hashimoto et al. ................... 522/84 |
| 5,753,320 | 5/1998 | Mikoshiba et al. .................. 427/572 |
| 5,763,018 | 6/1998 | Sato .................................... 427/535 |
| 5,820,942 | 10/1998 | Singh et al. ......................... 427/508 |

FOREIGN PATENT DOCUMENTS

| | | |
|---|---|---|
| 673962 | 4/1990 | (CH) . |
| 2151809 | 4/1972 | (DE) . |
| 59-16327 | 1/1984 | (JP) . |
| 2194164 | 1/1990 | (JP) . |
| 1409340 | 7/1988 | (SU) . |
| 1579579 | 7/1990 | (SU) . |

OTHER PUBLICATIONS

DuPont Teflon AF amorphous Fluoropolymer brochure, Wilmington, Delaware.
Photoreactive Materials, Chapter 10, pp. 662–700.
Imperial Chemical Industries Limited; "Notes on Drying Paints"; 1944.

* cited by examiner

Primary Examiner—Christopher G. Young
(74) Attorney, Agent, or Firm—Dority & Manning, PA

(57) ABSTRACT

The present invention is generally directed to a process and a system for forming photoresist coatings on a semiconductor wafer. In particular, according to the present invention, a solution containing a photoresist material is atomized in a reaction vessel and directed towards a semiconductor wafer. The semiconductor wafer can be preheated. The atomized liquid is heated, such as by being exposed to light energy which causes the photoresist material to form a coating on the substrate.

29 Claims, 3 Drawing Sheets

METHOD FOR DEPOSITING ATOMIZED MATERIALS ONTO A SUBSTRATE UTILIZING LIGHT EXPOSURE FOR HEATING

FIELD OF THE INVENTION

The present invention is generally directed to a method for depositing a solid material on a substrate. More particularly, the present invention is directed to a process for depositing photoresist materials onto semiconductor wafers. For instance, in one embodiment, a liquid solution containing a photoresist material is atomized and deposited onto a semiconductor wafer while the wafer is being contacted with at least one energy source.

BACKGROUND OF THE INVENTION

In general, an integrated circuit refers to an electrical circuit contained on a single monolithic chip containing active and passive circuit elements. Integrated circuits are fabricated by diffusing and depositing successive layers of various materials in a preselected pattern on a substrate. The materials can include semiconductive materials such as silicon, conductive materials such as metals, and low dielectric materials such as silicon dioxide. The semiconductive materials contained in integrated circuit chips are used to form ordinary electronic circuit elements, such as resistors, capacitors, diodes, and transistors.

Integrated circuits are extensively used in electronic devices, such as digital computers, because of their small size, low power consumption, and high reliability. The complexity of integrated circuits range from simple logic gates and memory units to large arrays capable of complete video, audio and print data processing. Presently, however, there is a demand for integrated circuit chips to accomplish more tasks in a smaller space while having even lower operating voltage requirements.

As stated above, integrated circuit chips are manufactured by successively depositing layers of different materials on a substrate. Typically, the substrate is made from a thin slice or wafer of n-type or p-type silicon. The active and passive components of the integrated circuit are built within a thin n-type epitaxial layer on top of the substrate. The components of the integrated circuit can include layers of different conductive materials such as metals and semiconductive materials surrounded by low dielectric insulator materials. In attempting to improve integrated circuit chips, attention has been focused upon not only using different materials to construct the chips but also upon discovering new processes for depositing the various layers of materials on the substrate.

The materials that are deposited in layers on semiconductor wafers generally need to be placed onto the wafer according to a predetermined pattern. In order to place the materials on the wafer according to a pattern, typically a coating is first formed on the wafer. Channels and pathways are then formed into the coating which provide the pattern for applying the materials that are used to form the integrated circuit. Applying the precursor coating on semiconductor wafers as described above is generally done through a lithographic process. Typically, five to twenty complete lithographic operations are required on each wafer depending on the type of integrated circuit. For most applications, the precursor coating applied to the wafer is made from a photoresist material, which is a photoreactive material whose properties are altered by optical radiation over a specified wavelength range. Due to the photoreactive properties of photoresist materials, patterns can be formed into the coatings using light energy.

For instance, in one embodiment, first the semiconductor wafer is coated with a photoresist material. The coating of the photoresist material should be uniform and should be highly adherent to the wafer. After the coating is applied to the wafer, the coating is typically baked at a temperature of up to about 100° C. in order to remove any solvents that may be contained within the coating.

The next step in the process is to form channels and pathways into the photoresist coating. This is done by first aligning the wafer with a mask that is printed with a predetermined pattern. For instance, the mask can be a gelatin photographic emulsion on a glass plate that is placed over the semiconductor wafer. The wafer is then exposed to light energy that reacts with the photoresist material. In particular, since the mask is placed over the wafer, the light energy being directed onto the wafer only contacts the photoresist coating according to the pattern that has been printed onto the mask.

After being exposed to light at a particular wavelength, if desired, the wafer can then be baked once again. After being baked, the wafer is rinsed in an appropriate solvent. Depending upon the type of photoresist material used, the solvent either removes the photoresist material that has been exposed to light or removes the photoresist material that has not been exposed to light. If the solvent removes the exposed portion of the photoresist coating, the photoresist material is considered a "positive" photoresist. If the solvent, on the other hand, removes the unexposed regions without effecting the exposed regions, the photoresist material is referred to as a "negative" photoresist. Regardless, once exposed to the solvent, portions of the photoresist coating are removed leaving behind a desired pattern.

Depending upon the particular application, the wafer can then be etched in order to remove those parts of the underlying film that are not covered by the photoresist. Etching results in the formation of windows in the mask film. Etching is performed in order to connect a layer to be deposited on a semiconductor wafer with a layer that has been deposited previously.

After etching, the next layer of the semiconductor wafer can be constructed. As mentioned above, the layer being deposited onto the patterned photoresist coating can be a semiconductive material, a conductive material, or a low dielectric material.

Thus, as described above, the lithographic process typically comprises the steps of coating a wafer with a photoresist and then taking a suitable patterned mask and imaging it onto the surface of the precoating. An engraving process is then performed where a pattern is formed into the photoresist coating. The pattern is used for opening windows in an underlying layer to define semiconductor regions and/or to remove metal from a coated wafer in order to delineate a pattern of interconnections.

In the past, in order to form a photoresist coating on a wafer, the photoresist materials have been spin coated onto the substrates.

According to this process, the substrate is first placed on a vacuum chuck and rotated at high speeds. A solution containing the photoresist is then applied to the substrate. Due to centrifugal force, a coating is formed on the substrate which is dried and annealed on a hot plate or in a furnace.

Difficulties, however, have been encountered with this process in getting the photoresist to adhere to the substrate and in producing a film having good physical properties.

Such deposition methods usually generates course material with undesirable physical properties. Further, other problems have also been experienced in controlling various parameters, such as the thickness and uniformity of the film especially when applied to larger wafers.

In view of the above deficiencies of the prior art, a need exists for a process for depositing photoresists on substrates for use in integrated circuit chips. In particular, a need exists for a process for uniformly depositing photoresists on substrates, such as silicon, during the fabrication of integrated circuits.

SUMMARY OF THE INVENTION

The present invention recognizes and addresses the foregoing disadvantages, and others of prior art constructions and methods.

Accordingly, it is an object of the present invention to provide a process for depositing a photoresist material on a substrate.

Another object of the present invention is to provide a process for depositing and adhering a photoresist coating on a semiconductor wafer using light energy.

It is another object of the present invention to provide a process for depositing a photoresist material on a substrate by converting a material in liquid form to a solid form using light energy.

It is another object of the present invention to provide a process for depositing layers of photoresist materials on a substrate, such as a silicon wafer, during the fabrication of integrated circuit chips.

These and other objects of the present invention are achieved by providing an improved chemical vapor deposition process. As used herein, chemical vapor deposition refers to a process by which a solid film or coating is grown from a liquid or gas precursor. In general, the process of the present invention includes directly injecting a liquid precursor containing a photoresist material into a reaction vessel containing a substrate. Once injected into the reactor vessel, the liquid precursor can be subjected to light energy, causing the liquid precursor to form a solid coating of the photoresist material on the substrate.

The process includes the steps of first atomizing a solution containing a photoresist material in a liquid form into droplets. The liquid droplets are directed onto a semiconductor wafer. Before and/or after contacting the wafer, the liquid droplets are exposed to light energy, which causes the photoresist material to form a solid coating on the substrate. In some configurations, the substrate is also heated to aid in the deposition process. The substrate can be preheated using indirect light energy, direct light energy or by an electrical resistance heater.

In one embodiment, the liquid droplets are directed onto the substrate in a reaction chamber. The reaction chamber can be capable of maintaining a vacuum if desired. The light energy absorbed by the liquid droplets can originate from lamps.

The liquid droplets that are formed from the solution containing the photoresist material can generally have a diameter of from about 10 microns to about 100 microns. The solution can be atomized by being fed through a nozzle. In one embodiment, the nozzle can be heated.

During the deposition process, preferably the semiconductor wafer that is being coated with the photoresist material is moved in a manner that facilitates formation of a uniform coating. For instance, during formation of the coating, the semiconductor wafer can be rotated, can be vibrated, or can be subjected to ultrasonic energy. For most applications, the semiconductor wafer should be preheated to a temperature of at least 50° C. and particularly from about 50° C. to about 150° C. During the process, the liquid droplets and the formed coating can be heated to a temperature of from about 100° C. to about 500° C. For most applications, the coating will have a thickness of at least 1,000 angstroms.

In one embodiment, the liquid droplets are deposited onto the semiconductor wafer at a temperature within a first temperature range. Once the droplets are deposited onto the semiconductor wafer, the temperature of the wafer can be further increased to a temperature within a second temperature range. It is believed that by applying some photoresist materials at two different temperatures, better adhesion may result between the wafer and the coating.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying figures, in which.

Figure 1:
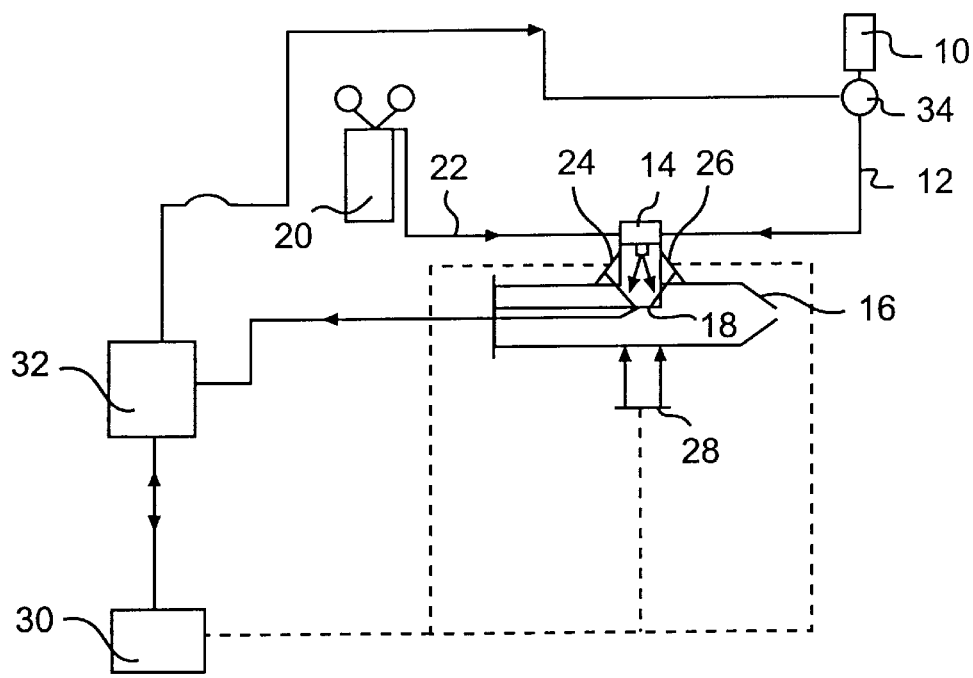
FIG. 1 is a plan view of one embodiment of a system for depositing a solid material on a substrate according to the present invention.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention which broader aspects are embodied in the exemplary construction.

As described above, integrated circuit fabrication requires the precise positioning of various materials on a semiconductor wafer. In particular, each layer formed on the wafer typically must be deposited into a predetermined pattern. In order to create a pattern on the surface of the wafer, the process generally includes the steps of first coating the wafer with a photoresist material. A suitable patterned mask is then placed over the wafer. After the mask is in place, an engraving process is carried out in which the photoresist layer is exposed to electromagnetic radiation at a particular wavelength according to the pattern formed into the mask. Depending on the photoresist material used, either the exposed regions of the photoresist material or the unexposed regions are removed leaving behind a desired pattern. The pattern is used to open windows in an underlying layer to define semiconductor regions, or to remove metal from a coated wafer in order to delineate an interconnection pattern. In the past, semiconductor wafers were coated with photoresist materials using a spincoating technique.

In general, the present invention is directed to a process and system for depositing a photoresist material on a substrate, such as a semiconductor wafer, using light energy. More particularly, liquid droplets containing a photoresist material are directed towards a substrate and exposed to light energy. The light energy causes the photoresist material contained within the droplets to form a solid coating on the substrate. Preferably, during the deposition process, the substrate is vibrated, rotated or subjected to ultrasonic energy in order to promote the formation of a coating having a uniform thickness. Also, in most applications, the substrate is preferably preheated prior to being contacted with the liquid droplets.

Referring to FIG. 1, a system for converting a liquid precursor containing a photoresist material into a solid coating on a substrate according to the present invention is illustrated. In order to initiate the process, first a liquid precursor is formulated and placed in a liquid reservoir 10. The liquid precursor contains, in some form, a photoresist material that is to be later converted into a solid. The liquid precursor can be a pure liquid or can be a solution. For instance, in one embodiment, the liquid precursor can contain the photoresist material dissolved in a solvent.

Figure 2:
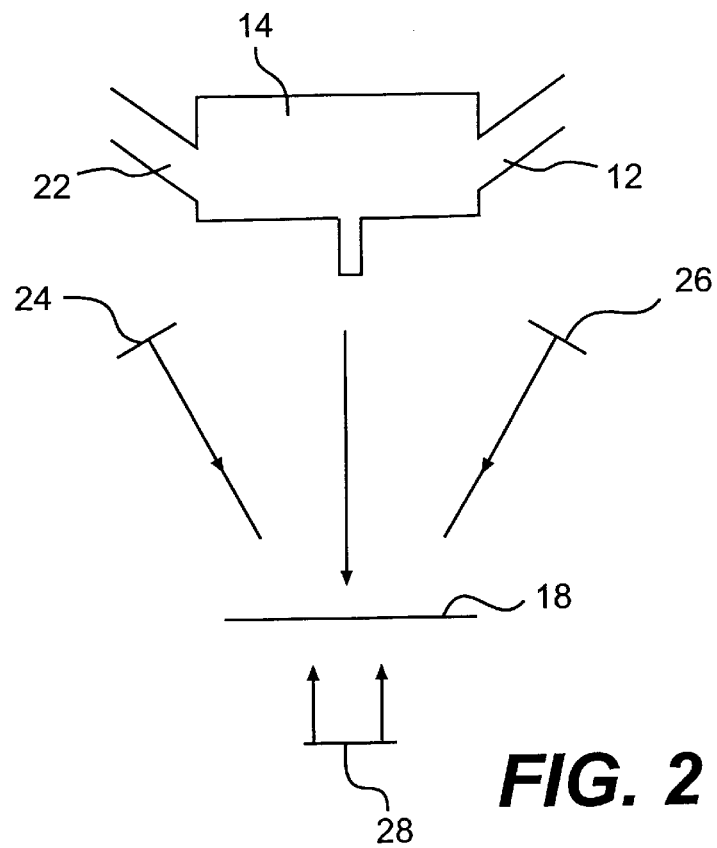
FIG. 2 is a plan view of one embodiment of a nozzle used to form solid materials according to the present invention.

The liquid photoresist precursor contained in liquid reservoir 10 according to the present invention is fed by a conduit 12 to a nozzle 14, which is more clearly shown in FIG. 2. Nozzle 14 atomizes the liquid precursor into liquid droplets. The liquid droplets are directly injected into a reactor vessel 16 towards a substrate 18.

In the embodiment illustrated in FIGS. 1 and 2, nozzle 14 atomizes the liquid precursor using a pressurized gas. Specifically, the system includes a gas reservoir 20 in communication with nozzle 14 via a gas conduit 22. The gas that is used to atomize the liquid precursor should not adversely interfere with the deposition process. In most applications, the gas used to atomize the liquid precursor should be an inert gas, such as argon or nitrogen.

In general, any suitable atomizing nozzle may be used in the process of the present invention. Also, more than one nozzle maybe used in the system, which, in some applications, may lead to better uniform application of the liquid precursor. For most applications, the nozzle should be designed to produce liquid droplets having a diameter of less than about 100 microns, and particularly from about 10 microns to about 100 microns. In an alternative embodiment to the system illustrated in FIG. 1, a nozzle can be chosen that does not use a pressurized gas in order to atomize a fluid. For instance, the nozzle may atomize the liquid using sound waves or some other high pressure source.

Figure 3:
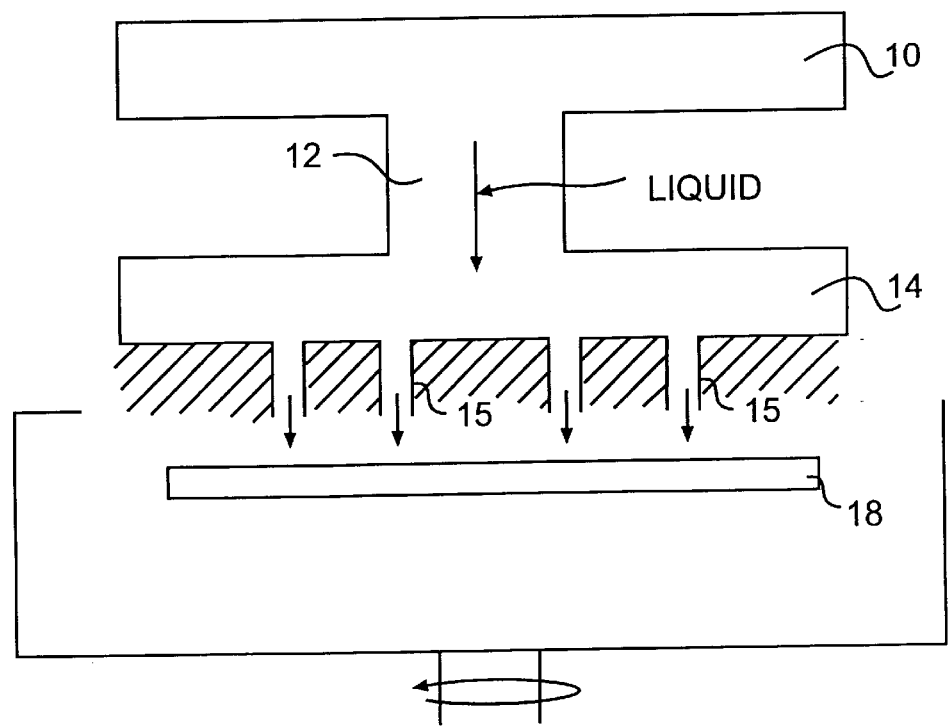
FIG. 3 is a cross-sectional view of an alternative embodiment of a nozzle and liquid reservoir that may be used in the process of the present invention.

Referring to FIG. 3, an alternative embodiment of a nozzle 14 for use in the process of the present invention is illustrated. In this embodiment, nozzle 14 includes a plurality of openings 15 which are designed to atomize the solution containing the photoresist material. Specifically, nozzle 14 includes a plurality of openings in order to uniformly disperse the liquid droplets over the surface of substrate 18.

If desired, the solution containing the photoresist material can be conditioned prior to being atomized. For instance, the chemical composition of the photoresist containing solution and the parameters of the solution such as viscosity, photosensitivity, pH value, purity, etc. can be selected and changed according to the particular application. Further, the temperature of the solution can be set within a desired range prior to being atomized. In this regard, in one embodiment, nozzle 14 can be designed to heat the solution as the solution is being atomized. In particular, nozzle 14 can be heated to a temperature so that there is no condensation of the liquid and so that the photoresist solution leaves the nozzle slightly vaporized but maintains the fluid characteristics of a liquid. For most applications, the solution should be heated as high as possible without forming a vapor so that the liquid will deposit on the substrate and will form a coating as quickly as possible.

Once the liquid precursor is atomized, the resulting liquid droplets are directed towards semiconductor wafer 18 in reactor vessel 16. Preferably, during and/or after deposition, semiconductor wafer 18 is moved in a manner that not only promotes attachment between the photoresist coating and the wafer but also assists in forming a coating having a uniform thickness. For instance, semiconductor wafer 18 can be rotated during the process, vibrated, and/or subjected to ultrasonic energy. For example, in one embodiment, the wafer can be subjected to half a quarter circle vibrations. Alternatively, ultrasonic rotation is used so that the wafer is subjected to both rotational and vibrational effects.

In an alternative embodiment, prior to formation of the photoresist coating, a thin adhesion layer can be formed on the semiconductor wafer. The adhesion layer can be included in order to improve the bond between the wafer and the photoresist coating. For example, in one embodiment, a sputtered layer of a material similar to the photoresist may be used.

In another alternative embodiment, the process of the present invention can be combined with conventional methods in forming a photoresist coating. For instance, a photoresist layer made according to the process of the present invention can be placed on top of or below a photoresist layer made according to conventional methods. For example, a thin photoresist layer can be deposited onto a semiconductor wafer in accordance with the present invention. Another photoresist layer can then be formed on top of the previous layer using spin coating techniques as described above. Alternatively, the semiconductor wafer can be first coated with a photoresist using spincoating techniques and then can be subjected to an additional photoresist layer using the process of the present invention. In this manner, photoresist coatings can be produced having various characteristics that may be desired for a particular application. Combining techniques may also create very thick coatings with improved properties.

Prior to atomizing the solution, semiconductor wafer 18 can be preheated in order to assist in the formation of the coating. For instance, for most applications the substrate can be heated to a temperature of from about 50° C. to about 150° C. The substrate can be heated using different and various energy sources. For example, semiconductor wafer 18 can be preheated using thermal light energy or can be heated by an electrical resistant heater.

Figure 1A:
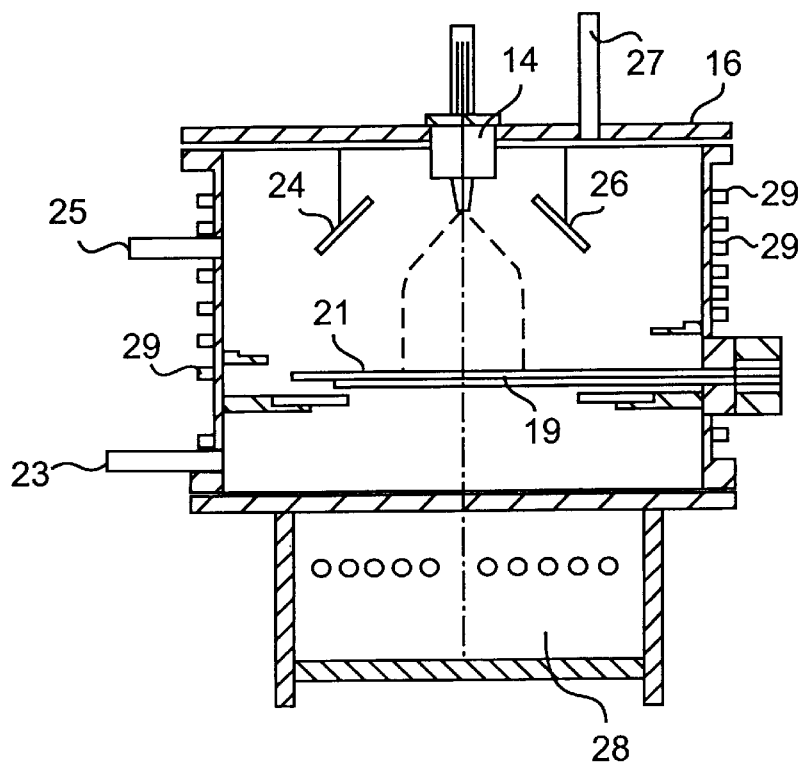
FIG. 1A is a cross sectional view of one embodiment of a reactor vessel that may be used in the process of the present invention.

As shown in FIGS. 1, 1a and 2, reactor vessel 16 includes lamps 28 positioned below semiconductor wafer 18. Lamps 28 can be designed to emit thermal energy which causes the temperature of the wafer to increase. Lamps 28 can be positioned to directly heat wafer 18 or can be positioned to indirectly heat the wafer. In one embodiment, besides emitting thermal energy, lamps 28 can also emit ultraviolet light including vacuum ultraviolet light. Ultraviolet light may be desirable in some applications in order to strengthen the bond that is formed between the photoresist coating and the wafer. As described above, however, photoresist materials are typically reactive to ultraviolet light at a particular wavelength. Thus, when used in the process of the present invention, the ultraviolet light should only contact the wafer or should be present in an amount that does not produce unwanted reactions. For example, the ultraviolet light can be emitted by an incoherent light source that produces ultraviolet light in a broad wavelength range.

According to the present invention, as the liquid droplets are directed towards substrate 18, they are heated, such as by being exposed to light energy. For instance, as shown in the figures, substrate 18 is surrounded by lamps 24 and 26 in addition to lamps 28. Lamps 24 and 26 can emit either optical energy, thermal energy, or both. Optical energy causes atomic and molecular excitation within the droplets, while thermal energy increases vibrational motion within the droplets. Optical energy can be provided by ultraviolet light, vacuum ultraviolet light, and visible light which is present at wavelengths of from about 0.05 microns to about 0.8 microns. If present, however, the optical energy should not be added in an amount sufficient to cause the photoresist material to undergo any unwanted chemical reactions.

For example, when the droplets and the resulting film are exposed to optical energy, preferably the optical energy is being generated by one or more incoherent light sources that provide ultraviolet light and/or vacuum ultraviolet light at many different wave lengths. For most applications, the photoresist material will be reactive to optical energy at a particular wavelength or a particular wavelength range. When forming the photoresist layer, the incoherent light sources should not produce a substantial amount of optical energy at the particular wavelength range to which the photoresist material is reactive.

Thermal energy, on the other hand, is contained in light having a wavelength of from about 0.4 microns and higher. Light at wavelengths in the range of from about 0.4 microns to about 0.8 microns provide both optical energy and thermal energy.

As the liquid droplets fall towards substrate 18, the light energy contacting the droplets causes the parent material contained within the liquid precursor to form a solid coating on the substrate. More particularly, the light energy can cause various chemical transformations to occur. For instance, in one embodiment, the liquid precursor can be a solution containing a solvent which is evaporated by the light energy. As the solvent is evaporated, the parent material falls out of solution and forms a solid.

Lamps 24, 26 and 28 need to deliver a sufficient amount of energy to the liquid droplets for causing the liquid droplets to vaporize, react, or decompose and transform the parent material into a solid. Generally, the precursor material can be heated to a temperature of from about 50° C. to about 700° C. during the process and particularly from about 100° C. to about 500° C.

Various lamps that may be used in the system of the present invention include arc lamps and tungsten halogen lamps, which emit both thermal and optical energy. Lamps that primarily emit ultraviolet light and can be used in the present invention include deuterium lamps, mercury vapor lamps, xenon lamps, and incoherent excimer lamps. As many lamps as are necessary for the process may be used and the lamps may be placed in any suitable configuration. The location of the lamps illustrated in the Figures is merely exemplary.

Through the use of lamps and light energy, the process of the present invention offers many advantages over conventional chemical vapor deposition processes incorporating furnaces and other similar heat sources to generate the solid material. For instance, the lamps have much higher heating and cooling rates than conventional furnaces. Through the use of lamps, a rapid isothermal processing system is produced. The lamps provide instantaneous energy, typically requiring no substantial start up period.

Further, the energy emitted by the lamps can be easily and precisely controlled and varied. For instance, during the process of the present invention, as the liquid precursor is formed into a solid, the energy absorbed by the liquid droplets has a tendency to cool the surrounding atmosphere. Light energy, as opposed to other energy sources, can be instantaneously increased during the process if necessary in order to maintain the reaction conditions constant. Specifically, light energy allows instantaneous recovery from any reactions or transformations occurring that are endothermic.

By using light energy and the use of lamps, the reaction rate and the rate at which the solid is formed can also be accurately controlled. For instance, formation of the solid during the process of the present invention can be abruptly stopped at any time simply by turning off the lamps and discontinuing the flow of light energy to the reaction chamber. The lamps can also be equipped with gradual power controls that can be used to increase or decrease the reaction rate with very quick response times.

The use of light energy can also provide other benefits and advantages beyond the formation of uniform photoresist coatings. For instance, during the fabrication of integrated circuits, various etching steps are conducted. The present inventor has discovered that exposing the wafer to ultraviolet light energy and particularly vacuum ultraviolet light energy, can remove impurities or unwanted residue that may remain after an etching step. In particular, it has been discovered that the ultraviolet light energy will volatilize the residue and cause further cleaning of the substrate prior to the next deposition step.

When light energy is used during the process of the present invention, reactor vessel 16 should be made from or lined by a material that acts as an insulator, has a low thermal mass, and is a poor heat conductor. By using a material that does not absorb heat or light energy, the energy requirements of the process are minimized. For instance, in one embodiment, reactor vessel 16 can be made from quartz and can include a substrate holder also made from quartz. Alternatively, the substrate holder can be made from graphite coated with silicon carbide.

In another embodiment, the lamps used to supply light energy to the process of the present invention can be placed inside the reactor vessel itself. In this embodiment, reactor vessel 16 can be made from any suitable material, including metals. By placing the lamps inside reactor vessel 16, the vessel need not be made from an insulator material.

Reactor vessel 16 should also be capable of being evacuated for creating a vacuum within the chamber. In particular, a vacuum may be needed when transmitting ultraviolet rays into the reaction vessel having a wavelength of less than about 0.2 microns. When such ultraviolet rays of light are not necessary to the process, however, reaction vessel 16 can be operated at normal atmospheric pressures.

Referring to FIG. 1A, one embodiment of a reactor vessel 16 that may be used in the process of the present invention is illustrated. Reactor vessel 16 includes a nozzle 14 which atomizes and directs a liquid precursor onto a substrate which is supported on a substrate holder 19. Substrate holder 19 is adapted to receive a temperature sensing device 21 for monitoring the temperature of the substrate during the process. Temperature sensing device 21 can be, for instance, a thermocouple or a pyrometer.

In this embodiment, reactor vessel 16 also includes a vacuum line 23 which can be used to create a vacuum within the vessel. On the other hand, if it is desired to pressurize the vessel or to maintain an inert atmosphere within the vessel, a gas line 27 is provided for introducing a gas into reactor vessel 16.

Reactor vessel 16 as shown in FIG. 1A further includes a cooling line 29, which is wrapped around the outside perimeter of the vessel. Cooling line 29 is adapted to circulate a cooling fluid such as water if desired. For instance, a cooling fluid can be circulated through line 29 in order to control and maintain the temperature within reactor vessel 16.

Referring to FIG. 1, the process of the present invention can be fully automated if desired. For example, the system can include a controller 30 such as a microprocessor or computer. Controller 30 is in communication with lamps 24, 26 and 28 and in communication with a temperature controller 32. Temperature controller 32 monitors the temperature of substrate 18, such as through a thermocouple as illustrated in FIG. 1A. Temperature controller 32 is also in communication with a valve 34, such as a solenoid valve.

In this arrangement, controller 30 can receive information from temperature controller 32 and, based on the information, control the amount of light energy emitted by lamps 24, 26 and 28. Controller 30 also controls the flow rate of the liquid precursor from liquid reservoir 10 to nozzle 14. For instance, controller 30 can be programmed to only feed the liquid precursor into reactor vessel 16 when substrate 18 is within a particular temperature range. Further, the temperature within reactor vessel 16 can be maintained and controlled by automatically adjusting the amount of energy emitted by lamps 24, 26 and 28. Thus, a further benefit to using light energy in the process of the present invention is the ability to accurately control the process and the reaction conditions from a remote location.

According to the process of the present invention, in one embodiment, the deposition of the photoresist coating can be carried out at two different temperature ranges in order to promote adhesion between the coating and the semiconductor wafer. For instance, in one embodiment, the coating can be formed on the substrate at a first temperature range. After the coating has been deposited on the substrate, the temperature can then be increased to a second temperature range. For instance, in one embodiment, the coating can be deposited at a temperature of from about 50° C. to about 700° C. and then further heated to a temperature of from about 100° C. to about 700° C. It should be understood, however, that photoresist coatings made according to the present invention need not be baked after being deposited onto a semiconductor wafer as is necessary in many conventional techniques such as spin coating techniques. In particular, the process of the present invention is more efficient than prior art processes in removing unwanted solvents in the deposition process, eliminating the need to later bake the coatings.

In another aspect of the present invention, instead of subjecting formed coatings to heat, the coatings can be subjected to optical energy an amount that may improve the characteristics of the coating. For example, after a coating has been formed, the coating can be subjected to ultraviolet light and/or vacuum ultraviolet light being emitted by an incoherent light source. This aspect of the present invention can be used with photoresist coatings formed according to the process of the present invention or with photoresist coatings formed according to conventional techniques, such as spin coating techniques.

Photoresist coatings made according to the present invention can have various thicknesses and can be deposited on various substrates. The present invention is particularly well suited to applying coatings to larger diameter wafers. In particular, the process is well adapted to creating a coating with a uniform thickness. For most applications, the coating will have a thickness of at least 500 angstroms, such as from about 10,000 angstroms to about 25,000 angstroms.

In one embodiment, the process of the present invention can be advantageously used to create relatively thick photoresist coatings. In particular, it has been discovered by the present inventor that very thick photoresist coatings can be formed on semiconductor wafers according to the present invention having reduced stress, thereby reducing the likelihood of subsequent cracking of the coating as typically happens in many conventional processes.

It should be understood that the present invention is also particularly well adapted to producing thin photoresist coatings. Because the process can be controlled accurately and because very uniform coatings can be formed, the process is also well adapted to forming very thin coatings.

The actual photoresist material that may be used in the process of the present invention can vary depending upon the particular application. In general, any suitable positive photoresist or negative photoresist may be used. Examples of negative photoresists include polymeric organic materials, such as poly(vinylcinnamate), poly-isoprene rubbers such as cyclized cis-poly-isoprene in combination with a cross-linking component such as a bisazide. The above negative photoresist materials are readily soluble in various solvents prior to exposure to ultraviolet light. These solvents include aromatic solvents such as benzene, toluene, xylene, an isodecane, "N"butyl acetate or isopropyl alcohol.

Positive photoresist materials that may be used in the present invention include, for instance, a combination of a low molecular weight alkali-soluble resin such as phenol formaldehyde novolac, a photoactive dissolution inhibitor which can be an orthoquinone diazide or other similar compound, and a solvent such as xylene or cellosolve acetate. Upon exposure to light at a particular wavelength, positive photoresists degrade and become soluble in various solvents, particularly alkalis such as sodium hydroxide, potassium hydroxide or tetramethylammonium hydroxide.

In one embodiment of the present invention, a positive photoresist solution that may be used in the process of the present invention contains from about 10% to about 25% by weight of a novolak resin, from about 10% to about 25% of a photo-active compound, such as naphthoquinone diazide, from about 50% to about 70% of a solvent such as ethylene glycol monoethyl ether acetate or propoylene glycol monoethyl ether acetate and, if desired, other additives such as xylene, or butyl acetate for facilitating drying and uniform application.

Other positive photoresists include polymethyl methacrylate and its derivatives. Recently, electron beam and x-ray resists systems have evolved which include polyolefin sulfones, such as poly(butenesulfone).

After a photoresist coating is formed in accordance with the present invention, the coating or film can be subjected to a engraving process in which a predetermined pattern is formed into the coating. Once engraved, the coating can then be used to form an integrated circuit.

In one embodiment of the present invention, the photoresist material fed to the chamber is in the form of a gas, such as a vapor. In this embodiment, the present invention can work similarly to the process described above directed to a liquid that is atomized. When a gas is being fed to the chamber, the light energy being emitted by the lamps can be used to convert the gas into a solid form on the semiconductor wafer.

When feeding a gas to a thermal processing chamber for reaction with a substrate within the chamber, the present invention is further directed to a system for purifying the gas prior to entry into the chamber. Although this process and system is well adapted for use with gas precursors that form photoresist coatings, it should be understood that this process can also be used to purify metallic, dielectric and semiconducting precursor gases.

Figure 4:
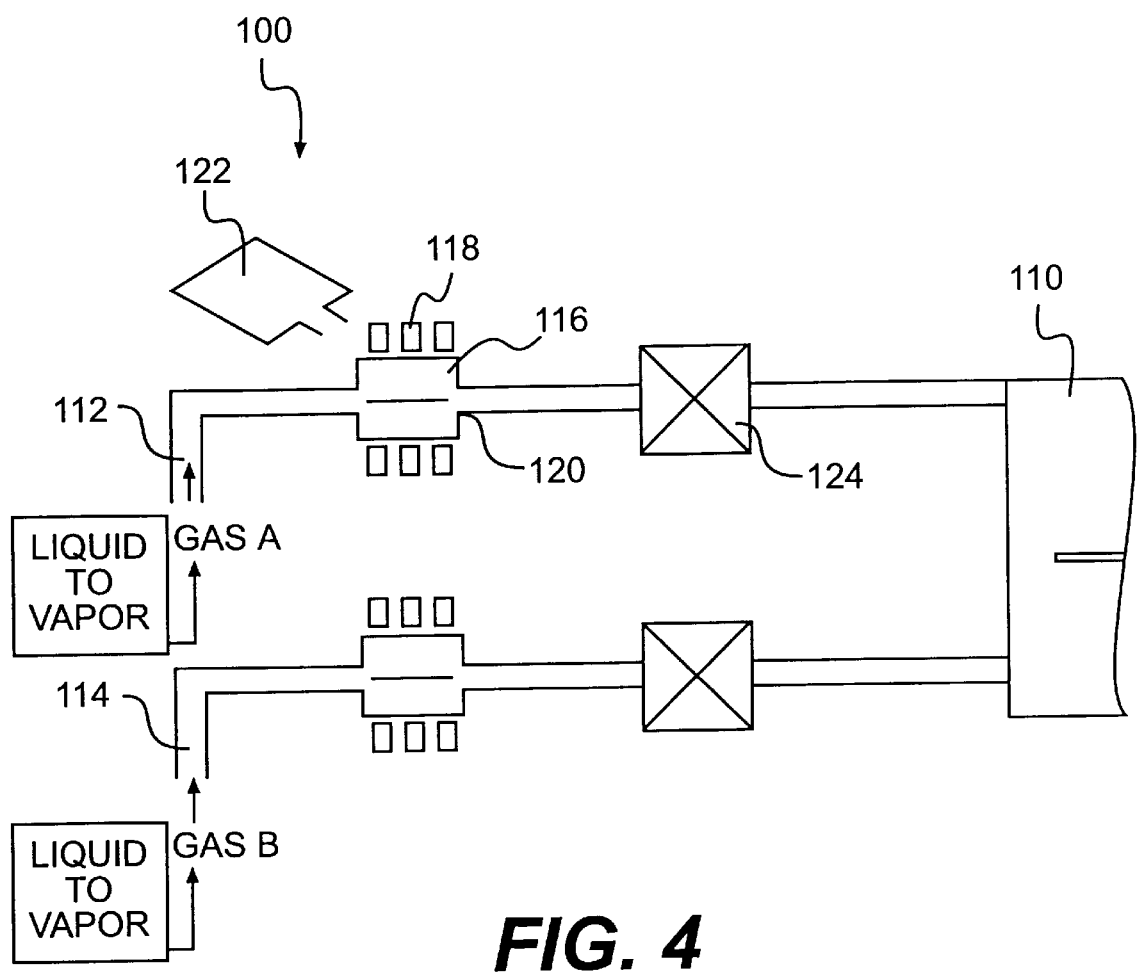
FIG. 4 is a plan view of one embodiment of a process for purifying materials being fed to a thermal processing chamber.

Referring to FIG. 4, one embodiment of a gas purifying system generally 100 is shown. In this embodiment, two gas streams 112 and 114 are being fed to a thermal processing chamber 110. Gas streams 112 and 114 can be used to feed the same gas into the chamber or can be used to feed different gases that react with each other, with the substrate, or provide a desired atmosphere within chamber 110. As shown in this embodiment, the gases being fed through gas lines 112 and 114 are formed by vaporizing a liquid.

In accordance with the present invention, gas stream 112 includes a catalytic minichamber 116 surrounded by a plurality of lamps 118. Lamps 118 can be designed to emit thermal energy but preferably emit ultraviolet radiation including vacuum ultraviolet radiation. According to the present invention, as gases are passed through chamber 116, the gases are exposed to electromagnetic radiation being emitted by the lamps. The electromagnetic radiation, such as ultraviolet radiation, reduces impurities within the gas, such as any unwanted carbon that may be contained within the gas stream. If desired, chamber 116 can include a catalytic plate 120 which is designed to increase the rate at which chemical dissociation occurs within the chamber. Catalytic plate 120 can be made from various materials and coated with standard metals, such as nickel.

The system can further include a spectroscope analyzer 122 that is designed to analyze the gas being fed through chamber 116. Analyzer 122 can be used to ensure that most of the impurities are being removed from the gas stream.

After leaving catalytic chamber 116, the gas is fed through a filter 124. Filter 124 filters out metallic, hydrocarbon and other impurities that may be contained within the gas prior to the gas entering the reaction chamber.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A process for depositing a photoresist material on a semiconductor wafer comprising the steps of:
    atomizing a solution into liquid droplets, said solution containing a photoresist material;
    exposing said liquid droplets to light energy such that the droplets are heated to a temperature sufficient for liquids contained in said droplets to evaporate;
    directing said heated liquid droplets onto a preheated semiconductor wafer in a thermal processing chamber such that said photoresist material forms a solid coating on said semiconductor wafer, said semiconductor wafer being preheated to a temperature of at least 50° C.; and
    engraving a predetermined pattern into said solid coating made from said photoresist material, said pattern being designed to facilitate the formation of an integrated circuit.

2. A process as defined in claim 1, wherein said liquid droplets are heated to a temperature of from about 100° C. to about 700° C. in forming said solid coating.

3. A process as defined in claim 1, wherein said liquid droplets have a diameter of at least 10 microns.

4. A process as defined in claim 1, wherein said liquid droplets are atomized by passing said solution through a nozzle, said nozzle being heated.

5. A process as defined in claim 1, wherein said semiconductor wafer is rotated during the formation of said solid coating.

6. A process as defined in claim 1, wherein said semiconductor wafer is vibrated during the formation of said solid coating.

7. A process as defined in claim 1, wherein said semiconductor wafer is exposed to ultraviolet light rays during said process.

8. A process as defined in claim 1, wherein said solid coating has a thickness of at least 1,000 angstroms.

9. A process as defined in claim 1, wherein said semiconductor wafer has been precoated with a spincoated layer of said photoresist material prior to forming said solid coating of said photoresist material on said semiconductor wafer.

10. A process as defined in claim 1, further comprising the step of spin coating an additional layer of said photoresist material on said formed solid coating.

11. A process as defined in claim 1, wherein said liquid droplets are heated to a temperature sufficient to remove substantially all of any solvent that may be contained in said liquid droplets during formation of said solid coating.

12. A process for depositing a photoresist material onto a semiconductor wafer comprising the steps of:
    atomizing a solution into liquid droplets, said solution containing a photoresist material;
    exposing said droplets to light energy within said thermal processing chamber, said light energy heating said droplets an amount sufficient for liquids contained in said droplets within said solution to evaporate; and
    directing said liquid droplets exposed to said light energy onto a semiconductor wafer in a thermal processing chamber such that said photoresist material forms a solid coating on said semiconductor wafer.

13. A process as defined in claim 12, further comprising the step of moving said semiconductor wafer during formation of said coating in a manner that promotes coating thickness uniformity.

14. A process as defined in claim 13, wherein said semiconductor wafer is rotated during the formation of said solid coating.

15. A process as defined in claim 13, wherein said semiconductor wafer is vibrated during formation of said coating.

16. A process as defined in claim 13, wherein said semiconductor wafer is subjected to ultrasonic energy during formation of said coating.

17. A process as defined in claim 12, wherein said light energy comprises thermal light energy.

18. A process as defined in claim 12, wherein said liquid droplets are deposited onto said semiconductor wafer at a temperature within a first temperature range and, after deposition, said coating is exposed to a temperature within a second temperature range, said second temperature range being higher than said first temperature range.

19. A process as defined in claim 12, wherein said semiconductor wafer is preheated by an electrical resistance heater.

20. A process as defined in claim 12, further comprising the step of preheating said semiconductor wafer prior to directing said droplets onto said semiconductor wafer.

21. A process for depositing a photoresist material onto a semiconductor wafer comprising the steps of:

atomizing a solution into liquid droplets, said solution containing a photoresist material, said droplets having a diameter of from about 10 microns to about 100 microns;

exposing said liquid droplets to light energy, said light energy heating said liquid droplets an amount sufficient for liquids contained in said droplets to evaporate, said light energy comprising thermal light energy;

directing said liquid droplets exposed to said light energy onto a preheated semiconductor wafer in a thermal processing chamber such that said photoresist material forms a solid coating on said semiconductor wafer, said semiconductor wafer being preheated to a temperature of at least 50° C.; and moving said semiconductor wafer during formation of said coating in a manner that promotes coating thickness uniformity.

22. A process as defined in claim 21, wherein said liquid droplets are heated to a temperature of from about 100° C. to about 500° C. during formation of said coating.

23. A process as defined in claim 21, wherein said semiconductor wafer is vibrated during formation of said coating.

24. A process as defined in claim 21, wherein said semiconductor wafer is rotated during formation of said coating.

25. A process as defined in claim 21, wherein said semiconductor wafer is exposed to ultraviolet radiation during formation of said coating.

26. A process as defined in claim 25, wherein said semiconductor wafer is preheated to at least 50° C. using light energy.

27. A process as defined in claim 21, wherein said solution is atomized by being fed through at least one heated nozzle.

28. A process as defined in claim 21, wherein said formed coating has a thickness of at least 500 angstroms.

29. A process as defined in claim 21, wherein said liquid droplets are heated to a temperature sufficient to remove substantially all of any solvents that may be contained within said liquid droplets during formation of said solid coating.

* * * * *